(12) United States Patent
Cohen et al.

(10) Patent No.: US 8,828,785 B2
(45) Date of Patent: Sep. 9, 2014

(54) SINGLE-CRYSTAL PHASE CHANGE MATERIAL ON INSULATOR FOR REDUCED CELL VARIABILITY

(75) Inventors: Guy Cohen, Mohegan Lake, NY (US); Simone Raoux, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 176 days.

(21) Appl. No.: 13/611,020

(22) Filed: Sep. 12, 2012

(65) Prior Publication Data

US 2014/0069577 A1 Mar. 13, 2014

(51) Int. Cl.
*H01L 21/00* (2006.01)

(52) U.S. Cl.
USPC ....... 438/95; 438/102; 438/459; 257/E31.029

(58) Field of Classification Search
CPC .... H01L 45/1608; H01L 45/065; H01L 45/06
USPC ....... 438/95, 102, 459; 257/E21.662, 27.104, 257/E31.029
See application file for complete search history.

(56) References Cited

U.S. PATENT DOCUMENTS

| | | | |
|---|---|---|---|
| 4,562,137 A | 12/1985 | Sanders | |
| 4,845,533 A * | 7/1989 | Pryor et al. | 257/4 |
| 5,063,097 A * | 11/1991 | Hirota et al. | 428/64.6 |
| 6,033,766 A * | 3/2000 | Block et al. | 428/210 |
| 6,593,213 B2 * | 7/2003 | Stanbery | 438/478 |
| 6,736,986 B2 * | 5/2004 | Stanbery | 216/13 |
| 7,037,994 B2 | 5/2006 | Sugita et al. | |
| 7,244,549 B2 | 7/2007 | Iwasawa et al. | |
| 7,303,855 B2 | 12/2007 | Hatakeyama et al. | |
| 7,358,025 B2 | 4/2008 | Hatakeyama | |
| 8,198,181 B1 * | 6/2012 | Kim et al. | 438/514 |
| 2011/0036396 A1 * | 2/2011 | Jayaraman et al. | 136/255 |
| 2011/0049455 A1 | 3/2011 | Breitwisch et al. | |
| 2011/0108792 A1 | 5/2011 | Lam et al. | |
| 2012/0068136 A1 | 3/2012 | Park et al. | |
| 2012/0097911 A1 | 4/2012 | Quick et al. | |
| 2012/0153429 A1 * | 6/2012 | Farooq et al. | 257/506 |
| 2013/0175672 A1 * | 7/2013 | Sadaka et al. | 257/617 |
| 2014/0069577 A1 * | 3/2014 | Cohen et al. | 156/230 |
| 2014/0070155 A1 * | 3/2014 | Cohen et al. | 257/2 |

OTHER PUBLICATIONS

"Phase Change Materials: Science and Applications," Simone Raoux (Editor), Matthias Wuttig (Editor) ISBN-10: 0387848738 (2009), p. 210 and pp. 219-223.

(Continued)

*Primary Examiner* — Jarrett Stark
(74) *Attorney, Agent, or Firm* — Louis J. Percello; Michael J. Chang, LLC (57) ABSTRACT

Techniques for producing a single-crystal phase change material and the incorporation of those techniques in an electronic device fabrication process flow are provided. In one aspect, a method of fabricating an electronic device is provided which includes the following steps. A single-crystal phase change material is formed on a first substrate. At least one first electrode in contact with a first side of the single-crystal phase change material is formed. The single-crystal phase change material and the at least one first electrode in contact with the first side of the single-crystal phase change material form a transfer structure on the first substrate. The transfer structure is transferred to a second substrate. At least one second electrode in contact with a second side of the single-crystal phase change material is formed. A single-crystal phase change material-containing structure and electronic device are also provided.

15 Claims, 6 Drawing Sheets

(56) References Cited

OTHER PUBLICATIONS

Tong and Gosele, "Semiconductor Wafer Bonding," Wiley & Sons, 1999.
Braun et al., "Epitaxial Phase Change Materials: Growth and Switching of Ge2Sb2Te5 on GaSb(001)" MRS Proceedings, vol. 1160, 1160-H14-05 doi: 10.1557/PROC-1160-H14-05 (2009).
Braun et al., "Epitaxy of Ge—Sb—Te phase-change memory alloys" Appl. Phys. Lett. 94, 041902 (2009).
Chaiken et al., Ultrahigh Density Data Storage using Epitaxial Phase-Change Media Diodes, Conference Abstract from 11th Foresight Conference on Molecular Nanotechnology (Oct. 10-12, 2003, Burlingame, CA).
Gibson et al., "Phase-change recording medium that enables ultrahigh-density electron-beam data storage," Applied Physics Letters 86, 051902 (2005).
Meister et al., "Synthesis and Characterization of Phase-Change Nanowires," Nano Letters, vol. 6, No. 7, 1514-1517 (2006).

* cited by examiner

PATTERNING OF PHASE CHANGE MATERIAL TO PHYSICALLY ISOLATE INDIVIDUAL CELLS

TRANSMISSION ELECTRON MICROSCOPE
IMAGE OF SINGLE-CRYSTAL GeSbTe

YKT 3171 c-GST Tg=175C, I/I+RTA
Yu Zhu Brandon Harrison, Guy Cohen

SINGLE-CRYSTAL PHASE CHANGE MATERIAL ON INSULATOR FOR REDUCED CELL VARIABILITY

FIELD OF THE INVENTION

The present invention relates to phase change materials, and more particularly, to techniques for producing a single-crystal phase change material and the incorporation of those techniques in an electronic device fabrication process flow.

BACKGROUND OF THE INVENTION

Phase-change materials, such as chalcogenides, can be switched between two states, poly-crystalline and amorphous, based on heat produced by the passage of an electric current. In the poly-crystalline state, each grain of the material is a perfect crystal and the material is conductive (almost metallic). It is notable however that each of the grains is randomly oriented with respect to the other grains resulting in an overall poly-crystalline material. In the amorphous state, there is no order in the material and the material is highly resistive. These two states make phase-change materials particularly well-suited for storing data.

To change the phase change material from the amorphous to the poly-crystalline state the material is heated above its crystallization temperature for a sufficiently long time. It will arrange itself into a poly-crystalline state during that heating time. To change the material from the poly-crystalline state to the amorphous state it will be heated above its melting temperature and then quenched (quickly cooled). It will not have time to rearrange itself in an ordered state, and an amorphous state will result. Both the crystallization temperature and melting temperature vary depending on the particular phase change material.

With conventional processes, variations in the atomic structural arrangement of the phase change material typically occur. This variation is not a great concern when large volumes of the material are used in each device. With scaling, however, the volume of the phase change material used in each device is reduced. In that case, the structure of the material can have a significant impact on device variability.

Accordingly, techniques for reducing, or eliminating, variability in a phase change material would be desirable.

SUMMARY OF THE INVENTION

The present invention provides techniques for producing a single-crystal phase change material and the incorporation of those techniques in an electronic device fabrication process flow. In one aspect of the invention, a method of fabricating an electronic device is provided. The method includes the following steps. A single-crystal phase change material is formed on a first substrate. At least one first electrode in contact with a first side of the single-crystal phase change material is formed. The single-crystal phase change material and the at least one first electrode in contact with the first side of the single-crystal phase change material form a transfer structure on the first substrate. The transfer structure is transferred to a second substrate. At least one second electrode in contact with a second side of the single-crystal phase change material is formed.

In another aspect of the invention, a structure is provided. The structure includes a substrate; an insulator over the substrate; and a single-crystal phase change material over the insulator.

In yet another aspect of the invention, an electronic device is provided. The electronic device includes a substrate; an insulator over the substrate; and a single-crystal phase change material over the insulator, wherein the single-crystal phase change material makes up a plurality of cells of the electronic device, each of the cells being configured to have one of two forms: 1) a first form consisting solely of single-crystal phase change material, and 2) a second form consisting of a region of single-crystal phase change material in contact with a region of amorphous phase change material.

A more complete understanding of the present invention, as well as further features and advantages of the present invention, will be obtained by reference to the following detailed description and drawings.

DETAILED DESCRIPTION OF PREFERRED EMBODIMENTS

While, as described above, the poly-crystalline state of the phase change material is made up of many small crystals, the crystals themselves are not correlated from one grain of the material to another. Each of the grains of the material is a crystal, and thus these terms are being used synonymously herein. One important difference in the grain properties is their orientation. There is also a size distribution (i.e., each grain can have a different size). The shape of grains can also be different. Thus, variability throughout the material commonly exists.

When making a memory array, the material is divided into memory cells with each cell representing a bit. If the volume of material allocated to each cell (bit) is large, variability is not a major concern. Each bit will contain many grains and the bit properties will be determined by the average over many grains. As a result, large cells will be similar to one another. By comparison, if the volume of the cells is small, then the variability in grain properties can have a significant impact on device variability. Namely, if each cell captures 1 or 2 grains (or even just a fraction of a grain), then variability in the grains can have a significant impact on the bit properties since the bit properties are no longer averaged over many grains as was the case in a large volume cell. Grain differences can affect properties of the material, such as resistivity. As memory technology evolves, the volume of phase change material allocated for each bit is shrinking to allow for more data storage (more bit cells). The shrinking size of the memory cell therefore requires that the issue of variability be addressed.

As provided above, variability in the crystal structure of phase change materials can be problematic when the volume of the material allocated for a bit is small, such as in the case of device scaling. Advantageously, provided herein are techniques for producing a single-crystal phase change material (i.e., a phase change material having the same crystal structure anywhere throughout the film).

Figure 1A:
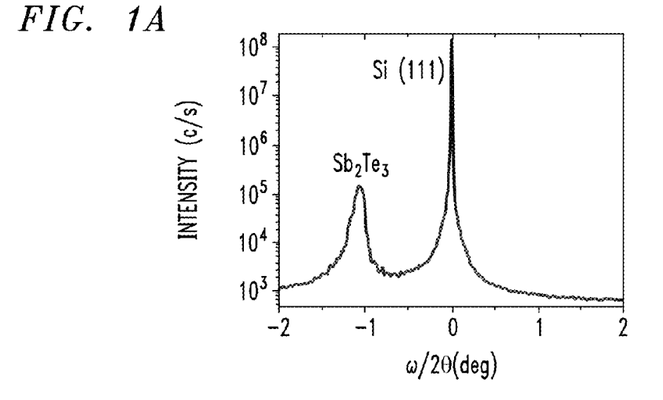
FIG. 1A is an high-resolution x-ray diffraction measurement for a first exemplary single-crystal phase change material, antimony telluride ($Sb_2Te_3$) according to an embodiment of the present invention.
Figure 1B:
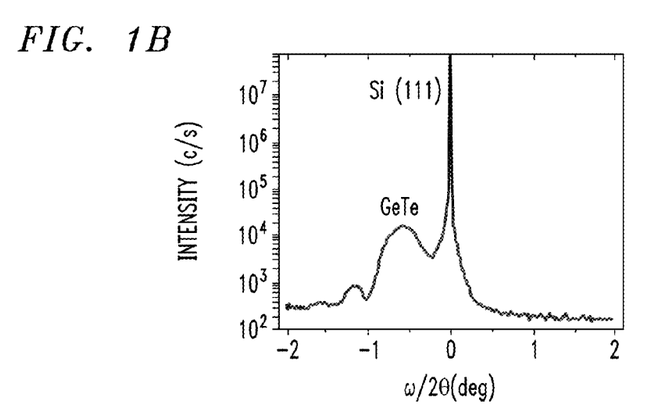
FIG. 1B is an high-resolution x-ray diffraction measurement for a second exemplary single-crystal phase change material, germanium telluride (GeTe) according to an embodiment of the present invention.
Figure 1C:
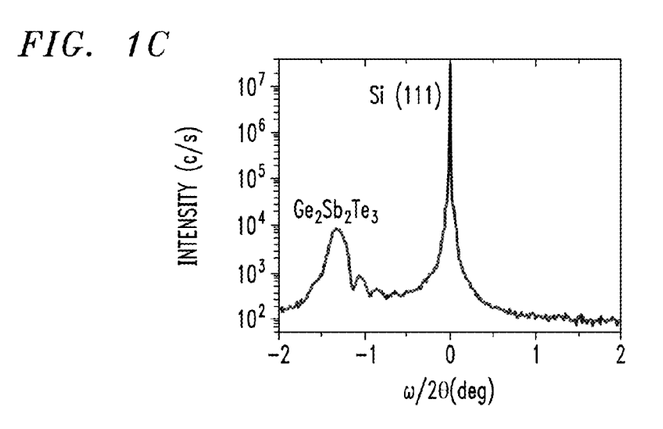
FIG. 1C is an high-resolution x-ray diffraction measurement for a third exemplary single-crystal phase change material, germanium-antimony telluride ($Ge_2Sb_2Te_5$) according to an embodiment of the present invention.

A single-crystal material is typically analyzed by x-ray diffraction. FIGS. 1A-C are high-resolution x-ray diffraction of three different phase change materials films that were expitaxially grown over Si (111). In FIGS. 1A-C ω is the angle between the incident beam and the sample surface, and $2\theta_B$ is the angle between the detector (diffracted beam) and the incident beam, i.e., it is twice the Bragg angle $\theta_B$. FIGS. 1A-C are high-resolution x-ray diffraction measurements showing a diffraction peak from the Si (111) substrate and an additional diffraction peak that originates from the single-crystal phase change material layer. The single-crystal structure of the phase change material layer was further confirmed by high-resolution transmission electron microscopy (TEM) analysis (see FIG. 18, described below). The x-ray diffraction pattern for a first exemplary phase change material, antimony telluride ($Sb_2Te_3$), is shown in FIG. 1A, the x-ray-diffraction pattern for a second exemplary phase change material, germanium telluride (GeTe) is shown in FIG. 1B, and the x-ray diffraction pattern for a third exemplary phase change material, germanium-antimony telluride ($Ge_2Sb_2Te_5$) is shown in FIG. 1C. Each sample, a chalcogenide phase change material, was formed on a Si (111) wafer. It is notable that the present techniques are not in any way limited to these particular phase change materials. FIGS. 1A-C merely demonstrate that the creation of a single-crystal phase change material is possible and these exemplary materials were chosen due to having key properties that make them a good material choice for data storage. Among these properties are: fast switching speed between the amorphous to crystalline phases and vice versa, long retention time (i.e., once the material is set to one of the phases it remains in that phase for a period of time measured in years), large resistivity ratio between amorphous and crystalline states which makes it easy to determine the material phase with an appropriate read circuitry.

Implementation of the present techniques will now be further demonstrated by way of reference to exemplary electronic device fabrication process flows. FIGS. 2-8 demonstrate a first exemplary electronic device fabrication process flow which begins with a substrate 200. As will be described in detail below, the present teachings involve a layer transfer process which enables a "phase change material on insulator" structure and also enables the formation of the electrodes in contact with opposite sides of the phase change material. This layer transfer process involves transferring the device structures, including the phase change material, from one substrate to another. Substrate 200 is the starting substrate and thus the first substrate in the process. See FIG. 2. Accordingly, substrate 200 may also be referred to herein as the first substrate. Substrate 200 is formed from a semiconductor material such as silicon (Si) or germanium (Ge). According to an exemplary embodiment, the starting substrate 200 (upon which the phase change material will be deposited—see below) is a Si (111) substrate. Si has a diamond crystal lattice structure. Si (111) notation refers to a specific set of atomic planes in the Si structure. The (111) crystal plane in an Si layer provides a regular arrangement of atoms on the surface of the layer. It is upon this regular surface that the phase change material will be deposited. According to another exemplary embodiment, the starting substrate 200 (upon which the phase change material will be deposited—see below) is a Ge (111) substrate. As described above, the (111) crystal plane in a Ge layer provides a regular arrangement of atoms on the surface of the layer. It is upon this regular surface that the phase change material will be deposited. It is expected that the present process would work on other substrates. It is notable that a good single-crystal phase change material was not attainable on a Si (100) substrate.

Figure 2:
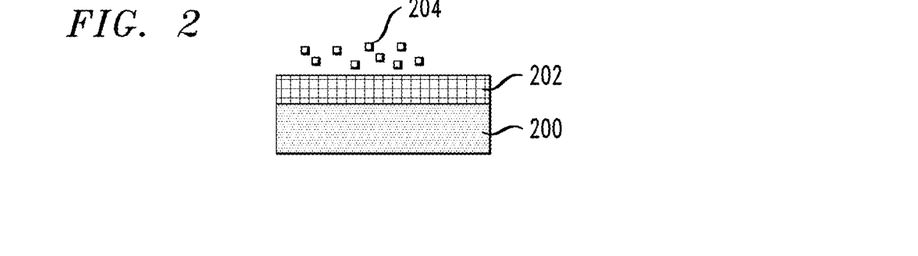
FIG. 2 is a cross-sectional diagram illustrating a single-crystalline phase change material having been formed on a (first) substrate according to an embodiment of the present invention.

Next a single-crystal phase change material 202 is formed on the substrate 200 by depositing a phase change material 204 onto the substrate 200. According to an exemplary embodiment, the phase change material 204 is deposited using an epitaxial process. In general, epitaxy involves the deposition of a crystalline material on a crystalline substrate. In the exemplary case of crystalline Si (111) or Ge (111) substrates, crystalline phase change material will be deposited by epitaxy onto the crystalline Si (111) or Ge (111) substrates. The Si (111) or Ge (111) material will be used as a template to get single-crystal growth of the phase change material.

It is notable that in conventional processes, the phase change material is typically deposited over an insulator, such as an oxide, or over an electrode. These materials provide an irregular/non-ordered surface for the phase change material growth. As a result, the phase change material forms as an amorphous material or a poly-crystalline material depending on the deposition temperature. Accordingly, in order to get a single-crystal phase change material, a single-crystal template such as a Si (111) surface is needed, and for most phase change materials the substrate also needs to be at a high temperature. If the deposition is done at a high temperature (exemplary deposition temperatures are provided below) on an amorphous material such as an oxide, the resulting phase change material would be poly-crystalline. If the deposition temperature is low (e.g., room temperature), the phase change material will be amorphous even if the substrate surface is a single-crystal Si (111) surface.

As described above, the present techniques are applicable to a wide variety of phase change materials 204. In the sense that it can exist in amorphous and crystalline form almost any material is a phase change material, such as metals, semiconductors or insulators. However, only a small group of materials has the properties that makes them technologically useful phase change materials, with high on/off resistance ratio, fast switching times and good data retention. Many technologically relevant phase change materials are chalcogenides, i.e., they contain one or more chalcogenide elements. These are Group 16 in the periodic table, e.g. sulfur (S), selenium (Se) or tellurium (Te). According to an exemplary embodiment, the phase change material 204 is a chalcogenide alloy that includes the chalcogenide element Te, in addition to other elements such as antimony (Sb) and/or germanium (Ge), forming the alloys $Sb_2Te_3$, GeTe, and $Ge_2Sb_2Te_5$. Other technologically relevant phase change materials that are not chalcogenides include semiconductor materials (such as gallium antimonide (GaSb)) or Ge—Sb based alloys. Often additional elements such as silver (Ag), indium (In), nitrogen (N) or bismuth (Bi) are added to the phase change alloys to optimize their properties. Suitable phase change materials 204 for use herein are provided, for example, in "Phase Change Materials: Science and Applications," Simone Raoux (Editor), Matthias Wuttig (Editor) ISBN-10: 0387848738 (2009), p. 210 and pp. 219-223 (hereinafter "Raoux"), the contents of which are incorporated by reference herein.

The specific precursors for the epitaxy depend of course on the particular phase change material being formed. For example, when physical vapor deposition (PVD) is used to deposit $Ge_2Sb_2Te_5$ the most common source is a $Ge_2Sb_2Te_5$ target. Separate elemental Ge, Sb and Te targets can also be used by adjusting the flux from each target to obtain the desired composition. In yet another example, molecular beam epitaxy (MBE) can also be used to deposit $Ge_2Sb_2Te_5$. When MBE is used the sources are usually individual Knudsen effusion cells. Each cell contains one of the alloy elements (Ge, Sb or Te), and the flux of each element is controlled by the effusion cell temperature. According to an exemplary embodiment, the deposition of the phase change material 204 onto the substrate 200 is performed at a high substrate temperature, for example, at a substrate temperature of from about 150 degrees Celsius (° C.) to about 300° C. For example, for $Ge_2Sb_2Te_5$ the preferred temperature range is from about 175° C. to about 200° C. The result is formation of the single-crystal phase change material 202 on the substrate 200. A room temperature deposition would typically yield amorphous material when $Ge_2Sb_2Te_5$ is deposited. However, some phase change materials such as $Sb_2Te_3$ would be crystalline even at deposition temperatures below 100° C.

Before the phase change material deposition the silicon wafer surface should be stripped of any oxide. To do so, the wafer may be etched in diluted hydrofluoric acid (DHF) and then immediately loaded to the deposition chamber. If the surface oxide is not removed, the deposited phase change material film will (undesirably) form as a poly-crystalline material (i.e., this would undesirably reproduce the conventional scenario where the phase change material is deposited onto an insulator, such as an oxide, see above).

Figure 3:
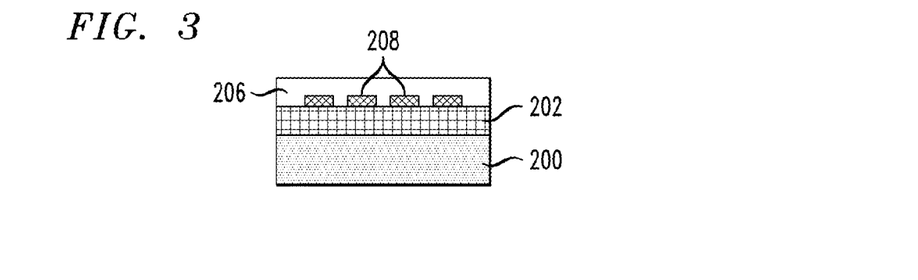
FIG. 3 is a cross-sectional diagram illustrating one or more electrodes having been formed on a first side of the single-crystal phase change material and a first planarizing dielectric layer having been formed on the first side of the single-crystal phase change material burying the electrodes according to an embodiment of the present invention.

One or more electrodes 208 are then formed on (a first side of) the single-crystal phase change material 202. The electrodes 208 may be formed from a suitable conductor, such as a metal selected from the group including tantalum nitride (TaN), titanium nitride (TiN), tungsten (W), copper (Cu), nickel (Ni), and/or platinum (Pt). According to an exemplary embodiment, the electrodes 208 are formed by depositing the particular electrode metal (for example, by sputtering or evaporation) onto the single-crystal phase change material 202 and then patterning the metal (for example, using photo-lithography) into electrodes 208. It is notable that the above-provided exemplary metals can react with the phase change material. In order to prevent any potential reaction between the electrode material and the phase change material, a barrier layer (such as titanium nitride (TiN)) can be first deposited onto the phase change materials and then the electrode(s) can be formed on the barrier layer.

During operation of the device, the electrodes 208 (in conjunction with a second set of electrodes to be formed below) are used to pass current through and heat the phase change material. As provided above, the height of the current pulse and its duration determines if the cell is switched in its state. If the phase change material is crystalline (conducting), the cell state is called SET state. If an amorphous area blocks the current path and completely covers the bottom electrode (see FIG. 15), the cell is in the RESET state. To switch from the RESET state to the SET state the amorphous material is heated above the crystallization temperature for a long enough time to crystallize (i.e., there is a crystallization temperature which is lower than the melting temperature and if the material is heated about the crystallization temperature it will crystallize and the material will remain in the crystalline phase when cooled to room temperature —it is noted that there is no melting of the material and cooling speed is not important). In this case, the crystalline state would be a single-crystal (as opposed to poly-crystalline) state. If the cell is switched from the SET to the RESET state the crystalline material is heated above the melting temperature and quenched fast enough to solidify in the amorphous state (i.e., here the cooling rate is important for the amorphization process, see below - very fast cooling (melt-quenching) is needed to solidify the molten material in the amorphous state without crystallization during cooling, because during cooling from the melt the material will pass through its crystallization temperature and this needs to happen faster than the crystallization time).

In order to permit the fabrication of additional layers of the device onto the electrode metal layer, a dielectric layer 206 is then deposited onto the electrodes 208/the (first side of) single-crystal phase change material 202, burying the electrodes 208. By way of example only, according to an exemplary embodiment, the dielectric layer 206 is formed from an organic planarizing material that is spin-coated onto the structure. By way of example only, the organic planarizing material can contain an aromatic cross-linkable polymer (e.g., naphthalene-based) in a solvent and is coated onto the structure to a thickness of from about 30 nanometers (nm) to about 300 nm. Other suitable organic planarizing materials include but are not limited to those materials described in U.S. Pat. No. 7,037,994 issued to Sugita et al. entitled "Acenaphthylene Derivative, Polymer, and Antireflection Film-Forming Composition," U.S. Pat. No. 7,244,549 issued to Iwasawa et al. entitled "Pattern Forming Method and Bilayer Film," U.S. Pat. No. 7,303,855 issued to Hatakeyama et al. entitled "Photoresist Undercoat-Forming Material and Patterning Process" and U.S. Pat. No. 7,358,025 issued to Hatakeyama entitled "Photoresist Undercoat-Forming Material and Patterning Process." The contents of each of the foregoing patents are incorporated by reference herein. A post-apply bake is then performed to cross-link the organic planarizing material and bake off the solvent. According to an exemplary embodiment, the post-apply bake is conducted at a temperature of up to about 250° C., e.g., from about 200° C. to about 250° C. The present techniques are however not limited to the above-described high-k materials. For instance, low-k dielectrics can also be used to form dielectric layer 206.

It is notable that the dielectric layer 206 (an insulator) is formed on the single-crystal phase change material 202. As will be described in detail below, wafer bonding/layer transfer techniques will be employed to transfer the single-crystal phase change material 202 (and other device structures) from the first substrate to another (second) substrate. This process results then in a single-crystal phase change material on an insulator (e.g., dielectric layer 206 and dielectric layer 210 (an insulator)—to be formed as described below). As described above, with conventional techniques the formation of a single-crystal phase change material on an insulator is not possible.

Metal-filled vias are then formed through the dielectric layer 206 down to the electrodes 208. See FIG. 4. By way of example only, the vias can be formed by patterning the dielectric with the location and footprint of the vias, and then filling the vias with a suitable metal(s), such as one or more of Cu, Ni and/or Pt. The process for fabricating vias in a contact structure is known to those of skill in the art and thus is not described further herein.

Figure 4:
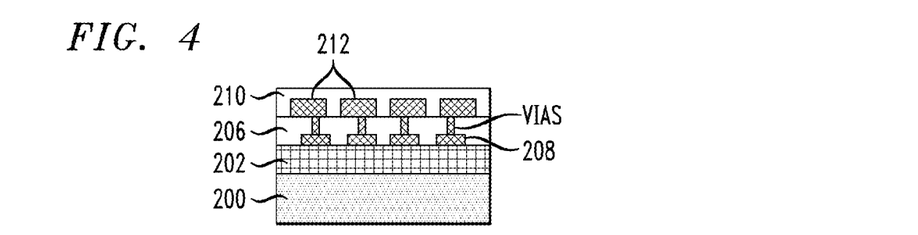
FIG. 4 is a cross-sectional diagram illustrating one or more interconnects and vias having been formed on/through the first planarizing dielectric layer and a second planarizing dielectric layer having been formed on the first planarizing dielectric layer burying the interconnects according to an embodiment of the present invention.

Next, as shown in FIG. 4, one or more interconnects 212 are fabricated on the dielectric layer 206 in contact with the vias. According to an exemplary embodiment, the interconnects 212 are formed by depositing a metal such as Cu, Ni or Pt (for example, by sputtering or evaporation) onto the dielectric layer 206 and then patterning the metal (for example, using photolithography) into interconnects 212. A dielectric layer 210 is then deposited onto the interconnects 212/the dielectric layer 206, burying the interconnects 212. By way of example only, according to an exemplary embodiment, the dielectric layer 210 is formed from an organic planarizing material that is spin-coated onto the structure. Suitable organic planarizing materials were described above.

Figure 5:
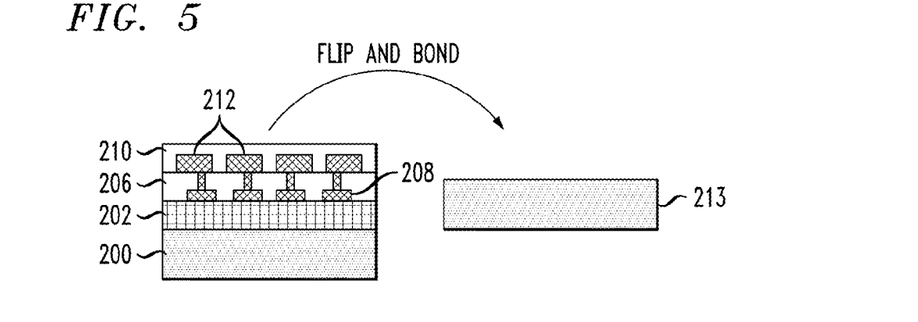
FIG. 5 is a cross-sectional diagram illustrating the device structure being flipped/inverted and a wafer bonding process being used to bond the device structure to a handle wafer according to an embodiment of the present invention.
Figure 6:
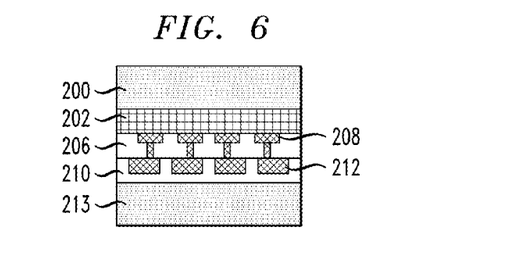
FIG. 6 is a cross-sectional diagram illustrating the results of the flipping and wafer bonding process according to an embodiment of the present invention.
Figure 7:
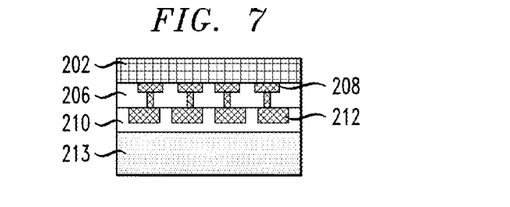
FIG. 7 is a cross-sectional diagram illustrating the Si substrate having been removed to permit additional layers of the device to be fabricated on a second side of the single-crystal phase change material according to an embodiment of the present invention.

As shown in FIG. 5, a wafer bonding process is then used to bond the structure (containing the single-crystal phase change material) to a handle wafer. In this process, the structure is flipped (inverted) and the dielectric layer 210 is bonded to a handle wafer 213. As provided above, the starting substrate (substrate 200) is also referred to herein as the first substrate. This handle wafer is a (second) substrate to which the device structures (including the phase change material) are transferred in this wafer bonding-based layer transfer process. Accordingly, the handle wafer 213 may also be referred to herein as the second substrate (so as to differentiate it from the starting substrate 200). According to an exemplary embodiment, the handle wafer 213 is a Si wafer. Since the device structures (including the phase change material) are to be transferred from the first substrate to the second substrate, these device structures may also be referred to collectively herein as a transfer structure, i.e., collectively the structure to be transferred via the wafer bonding-based layer transfer process. In some cases the dielectric layer 210 may require additional planarization to enable bonding. Chemical mechanical polishing (CMP) may be applied to dielectric layer 210 to achieve the level of surface flatness and smoothness required to obtain good bonding. Since most phase change materials have a relative low melting temperature (for example $Ge_2Sb_2Te_5$ has a melting temperature of about 630° C.), low temperature bonding in the range of from about 300° C. to about 500° C. is preferable. The wafer bonding techniques employed in this step are known to those of skill in the art and thus are not described in further detail herein. A detailed description of wafer bonding can be found in Tong and Gosele, "Semiconductor Wafer Bonding," Wiley & Sons, 1999, the contents of which are incorporated by reference herein. The result of this flipping and wafer bonding process is shown in FIG. 6.

The (e.g., Si(111))-first wafer 200, which was used as a template for growth of the single-crystal phase change material 202—as described above, is then removed to permit additional layers of the device to be fabricated on a second side of the single-crystal phase change material. See FIG. 7. By way of example only, the wafer 200 may be removed selective to the single-crystal phase change material 202 using backside wafer grinding followed by a selective wet etching of silicon (e.g., TMAH).

Figure 8:
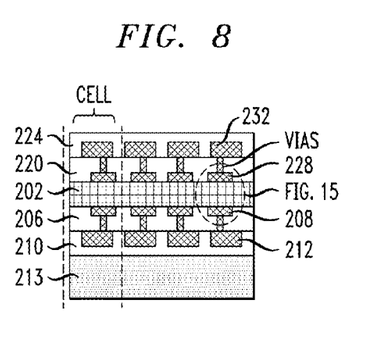
FIG. 8 is a cross-sectional diagram illustrating one or more electrodes having been formed on the second side of the single-crystal phase change material, a third planarizing dielectric layer having been formed on the second side of the single-crystal phase change material burying the electrodes, one or more interconnects and vias having been formed on/through the third planarizing dielectric layer and a fourth planarizing dielectric layer having been formed on the third planarizing dielectric layer burying the interconnects according to an embodiment of the present invention.

As provided above, the electrodes 208 were fabricated in contact with one side of the single-crystal phase change material. In order to permit heating of the single-crystal phase change material during operation of the device, a second set of electrodes is needed in contact with the other (opposite, second) side of the single-crystal phase change material. See FIG. 8. Namely, as shown in FIG. 8, electrodes 228 are formed on a side of the single-crystal phase change material 202 opposite the electrodes 208. Suitable electrode materials and processes for fabrication thereof were provided above. As provided above, a barrier layer such as TiN may be employed between the electrodes and the phase change material to prevent any undesirable interaction between these materials. The process from this point forward essentially mirrors the steps described above, now being performed on the opposite side of the single-crystal phase change material. Specifically, in the example shown in FIG. 8, a dielectric layer 220 is deposited onto the electrodes 228/the single-crystal phase change material 202, burying the electrodes 228. By way of example only, according to an exemplary embodiment, the dielectric layer 220 is formed from an organic planarizing material that is spin-coated onto the structure. Suitable organic planarizing materials were described above. As described above, it is notable that the dielectric layer 220 (an insulator) is formed on the single-crystal phase change material 202. Accordingly, the present techniques result then in a single-crystal phase change material on an insulator (e.g., dielectric layers 206/210 and 220 and dielectric layer 224 (an insulator)—to be formed as described below). As described above, with conventional techniques the formation of a single-crystal phase change material on an insulator is not possible.

Metal-filled vias are then formed through the dielectric layer 220 down to the electrodes 228. See FIG. 8. By way of example only, the vias can be formed by patterning the dielectric with the location and footprint of the vias, and then filling the vias with a suitable metal(s) as provided above.

Next, one or more interconnects 232 are fabricated on the dielectric layer 220 in contact with the vias. Suitable materials and methods for fabricating the interconnects were provided above. Lastly, a dielectric layer 224 is deposited onto the interconnects 232/the dielectric layer 220, burying the interconnects 232. By way of example only, according to an exemplary embodiment, the dielectric layer 224 is formed from an organic planarizing material that is spin-coated onto the structure. Suitable organic planarizing materials were described above.

The device as now fabricated consists of a plurality of cells, each cell corresponding to a pair of the electrodes 208 and 228 opposite one another (on opposite sides of the phase change material. See FIG. 8. Physical isolation of the cells is possible for example by removing the phase change material not covered by the top electrodes (electrodes 228). However, this is not required since when the cell is in the amorphous state, there is a layer of amorphous material over the electrode that blocks the current (see FIG. 15). When the cell is in the crystalline state the current flows in the least resistive path which is from the bottom electrode (electrode 208) to the top electrode (electrode 228) above it with very little spreading.

Figure 8A:
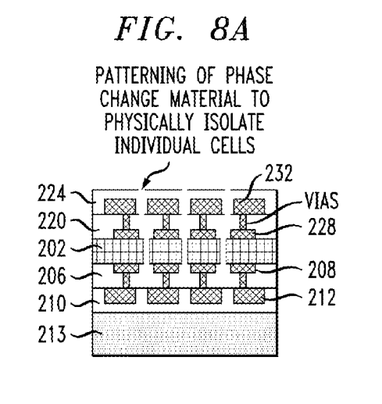
FIG. 8A is a cross-sectional diagram illustrating an optional step of patterning the phase change material (e.g., by removing the phase change material not covered by the top electrodes) so as to physically isolate individual cells having been performed according to an embodiment of the present invention.

Patterning of the phase change material (e.g., by removing the phase change material not covered by the top electrodes) so as to physically isolate the cells, could however, be performed if so desired. For instance, as shown in FIG. 8A, the additional step of patterning the phase change material has been performed. It is notable that the depiction in FIG. 8A is merely a schematic representation intended to illustrate physical isolation of the cells. However, in practice the gaps shown by the arrow in FIG. 8A would be filled with an insulator material. Additionally the gaps in the phase change material and the filling of the gaps would be done before depositing layer 220. In fact the pattering of electrodes 228 and that of the phase change material can be done in one step so that electrode 228 is self-aligned with the cell it controls. The gap between cells will be filled with an insulator material. This material can be same as dielectric layer 220.

FIGS. 9-14 demonstrate a second exemplary electronic device fabrication process flow based on the present techniques which employs the same principles as the example above. Namely, as above, this exemplary process flow begins with a Si substrate 900. As in the example provided above, this embodiment involves a layer transfer process which enables a "phase change material on insulator" structure and also enables the formation of the electrodes in contact with opposite sides of the phase change material. This layer transfer process involves transferring the device structures, including the phase change material, from one substrate to another. Substrate 900 is the starting substrate and thus the first substrate in the process. Accordingly, substrate 900 may also be referred to herein as the first substrate. Substrate 900 is formed from a semiconductor material such as Si or Ge. See FIG. 9. According to an exemplary embodiment, the starting substrate 900 (upon which the phase change material will be deposited—see below) is a Si(111) substrate. As provided above, the (111) crystal plane in a Si layer provides a regular arrangement of atoms on the surface which serves as a template for epitaxy. It is upon this regular surface that the phase change material will be deposited.

Figure 9:
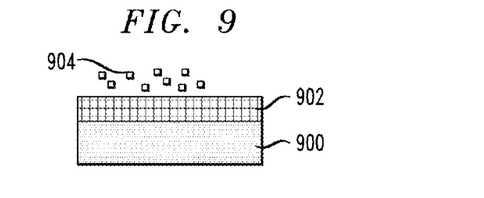
FIG. 9 is a cross-sectional diagram illustrating the starting structure of an alternative fabrication process flow, i.e., a single-crystalline phase change material formed on a Si substrate according to an embodiment of the present invention.

Next a single-crystal phase change material 902 is formed on the substrate 900 by depositing a phase change material 904 onto the substrate 900. According to an exemplary embodiment, the phase change material 904 is deposited using an epitaxial process. In general, epitaxy involves the deposition of a crystalline material on a crystalline substrate. In this case of a crystalline Si(111) substrate, crystalline phase change material will be deposited by epitaxy onto the crystalline Si(111) substrate. The Si(111) material will be used to get single-crystal growth of the phase change material.

As described above, the present techniques are applicable to a wide variety of phase change materials 904. According to an exemplary embodiment, the phase change material 904 is a (chalcogenide) alloy that includes at least two of the following elements: antimony (Sb), tellurium (Te) and germanium (Ge), such as $Sb_2Te_3$, GeTe, and $Ge_2Sb_2Te_5$. III-V semiconductor materials (such as gallium antimonide (GaSb)) may also be used. Suitable phase change materials 904 for use herein are provided, for example, in Raoux.

The specific precursors for the epitaxy depend of course on the particular phase change material being formed. For example, when PVD is used to deposit $Ge_2Sb_2Te_5$ the most common source is a $Ge_2Sb_2Te_5$ target. Separate Ge, Sb and Te targets can also be used by adjusting the flux from each target to obtain the desired composition. In yet another example, MBE can also be used to deposit $Ge_2Sb_2Te_5$. When MBE is used the sources are usually individual Knudsen effusion cells. Each cell contains one of the alloy elements (Ge, Sb or Te), and the flux of each element is controlled by the effusion cell temperature. According to an exemplary embodiment, the deposition of the phase change material 904 onto the substrate 900 is performed at a high substrate temperature, for example, at a substrate temperature of from about 150° C. to about 300° C. For example, for $Ge_2Sb_2Te_5$ the preferred temperature range is from about 175° C. to about 200° C. The result is formation of the single-crystal phase change material 902 on the substrate 900. A room temperature deposition would typically yield amorphous material when $Ge_2Sb_2Te_5$ is deposited. However, as provided above, some phase change materials such as $Sb_2Te_3$ would be crystalline even at deposition temperatures below 100° C.

Before the phase change material deposition the silicon wafer surface should be stripped of any oxide. To do so, the wafer may be etched in DHF and then immediately loaded to the deposition chamber. If the surface oxide is not removed, the deposited phase change material film will (undesirably) form as a poly-crystalline material (i.e., this would undesirably reproduce the conventional scenario where the phase change material is deposited onto an insulator, such as an oxide, see above).

Figure 10:
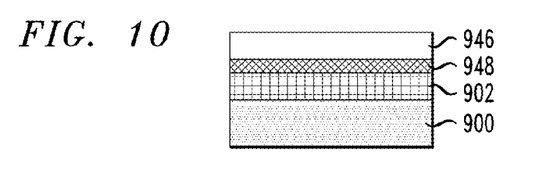
FIG. 10 is a cross-sectional diagram illustrating an electrode having been formed on a first side of the single-crystal phase change material and a first planarizing dielectric layer having been formed on the electrode according to an embodiment of the present invention.

A continuous, common electrode 948 is then formed on (a first side of) the single-crystal phase change material 902. The electrode 948 may be formed from a suitable conductor, such as a metal selected from the group including TaN, TiN, W, Cu, Ni, and/or Pt. According to an exemplary embodiment, the electrode 948 is formed by depositing the particular electrode metal (for example, by sputtering or evaporation) onto the single-crystal phase change material 902. It is notable that the above-provided exemplary metals can react with the phase change material. In order to prevent any potential reaction between the electrode material and the phase change material, a barrier layer (such as titanium nitride (TiN)) can be first deposited onto the phase change materials and then the electrode(s) can be formed on the barrier layer. During operation of the device, the electrode 948 (in conjunction with a second set of electrodes to be formed below) are used to pass current through and heat the phase change material. As provided above, the original state of the cell (SET or RESET) and the current height and duration dictates whether it forms an amorphous or crystalline material. In this case, the crystalline state would be a single-crystal (as opposed to poly-crystalline) state.

In order to permit the fabrication of additional layers of the device onto the electrode metal layer, a dielectric layer 946 is then deposited onto the electrode 948. By way of example only, according to an exemplary embodiment, the dielectric layer 946 is formed from an organic planarizing material that is spin-coated onto the structure. Suitable organic planarizing materials were described above. Since common electrode 948 is not patterned, no topography is introduced so the top surface of dielectric layer 946 is typically flat. This reduces the need for additional planarization by CMP to facilitate bonding.

Figure 11:
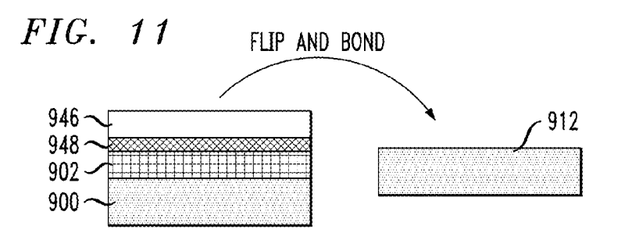
FIG. 11 is a cross-sectional diagram illustrating the device structure being flipped/inverted and a wafer bonding process being used to bond the device structure to a handle wafer according to an embodiment of the present invention.
Figure 12:
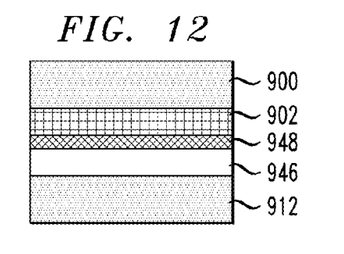
FIG. 12 is a cross-sectional diagram illustrating the results of the flipping and wafer bonding process according to an embodiment of the present invention.
Figure 13:
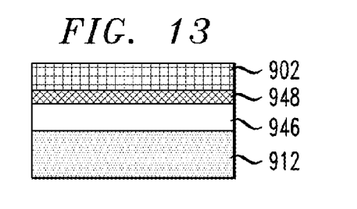
FIG. 13 is a cross-sectional diagram illustrating the Si substrate having been removed to permit additional layers of the device to be fabricated on a second side of the single-crystal phase change material according to an embodiment of the present invention.

As shown in FIG. 11, a wafer bonding process is then used to bond the structure (containing the single-crystal phase change material) to a handle wafer. In this process, the structure is flipped (inverted) and the dielectric layer 946 is bonded to a handle wafer 912. As provided above, the starting substrate (substrate 900) is also referred to herein as the first substrate. This handle wafer is a (second) substrate to which the device structures (including the phase change material) are transferred in this wafer bonding-based layer transfer process. Accordingly, the handle wafer 912 may also be referred to herein as the second substrate (so as to differentiate it from the starting substrate 900). According to an exemplary embodiment, the handle wafer 912 is a Si wafer. Since the device structures (including the phase change material) are to be transferred from the first substrate to the second substrate, these device structures may also be referred to collectively herein as a transfer structure, i.e., collectively the structure to be transferred via the wafer bonding-based layer transfer process. The wafer bonding techniques employed in this step are known to those of skill in the art and thus are not described in further detail herein. The result of this flipping and wafer bonding process is shown in FIG. 12.

The (e.g., Si(111))-first wafer 900, which was used as a template for growth of the single-crystal phase change material 902—as described above, is then removed to permit additional layers of the device to be fabricated on a second side of the single-crystal phase change material. See FIG. 13. By way of example only, the wafer 900 may be removed selective to the single-crystal phase change material 902 using backside wafer grinding followed by a selective wet etching of silicon (e.g., TMAH).

As provided above, the electrode 948 was fabricated in contact with one side of the single-crystal phase change material. In order to permit heating of the single-crystal phase change material during operation of the device, a second set of electrodes is needed in contact with the other (opposite, second) side of the single-crystal phase change material. See FIG. 14. Namely, as shown in FIG. 14, electrodes 968 are formed on a side of the single-crystal phase change material 902 opposite the electrode 948.

Figure 14:
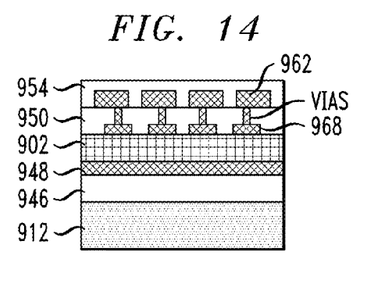
FIG. 14 is a cross-sectional diagram illustrating one or more electrodes having been formed on the second side of the single-crystal phase change material, a second planarizing dielectric layer having been formed on the second side of the single-crystal phase change material burying the electrodes, one or more interconnects and vias having been formed on/through the second planarizing dielectric layer and a third planarizing dielectric layer having been formed on the second planarizing dielectric layer burying the interconnects according to an embodiment of the present invention.

Next, in the example shown in FIG. 14, a dielectric layer 950 is deposited onto the electrodes 968/the single-crystal phase change material 902, burying the electrodes 968. By way of example only, according to an exemplary embodiment, the dielectric layer 950 is formed from an organic planarizing material that is spin-coated onto the structure. Suitable organic planarizing materials were described above. It is notable that the dielectric layer 950 (an insulator) is formed on the single-crystal phase change material 902. Accordingly, the present techniques result in a single-crystal phase change material on an insulator (e.g., dielectric layer 950 and dielectric layer 954 (an insulator)—to be formed as described below). As described above, with conventional techniques the formation of a single-crystal phase change material on an insulator is not possible.

Metal-filled vias are then formed through the dielectric layer 950 down to the electrodes 968. See FIG. 14. By way of example only, the vias can be formed by patterning the dielectric with the location and footprint of the vias, and then filling the vias with a suitable metal(s) as provided above.

Next, one or more interconnects 962 are fabricated on the dielectric layer 950 in contact with the vias. Suitable materials and methods for fabricating the interconnects were provided above. Lastly, a dielectric layer 954 is deposited onto the interconnects 962/the dielectric layer 950, burying the interconnects 962. By way of example only, according to an exemplary embodiment, the dielectric layer 954 is formed from an organic planarizing material that is spin-coated onto the structure. Suitable organic planarizing materials were described above.

By comparison with the first process flow described above, in this example, the steps performed on the first side of the single-crystal phase change material are simplified through the use of the single electrode on that side. Namely, by comparison with FIG. 3-8, described above, which involved the fabrication of electrodes, vias and interconnects on both sides of the single-crystal phase change material, here the vias and interconnects are only required on one side of the single-crystal phase change material.

It is notable that in this exemplary configuration, each of the electrodes 968 defines one "bit." The volume of the bit is defined by the current spread. Since the phase change material is conductive in the crystalline phase, most of the current flows from the top electrodes 968 to the (single) bottom electrode 948 in a straight line with little spreading. There is therefore little need to pattern the phase change material or the bottom electrode. Patterning of the phase change material (e.g., by removing the phase change material not covered by the top electrodes) so as to physically isolate the cells, could however, be performed if so desired. For instance, as shown in FIG. 14A, the additional step of patterning the phase change material has been performed.

Figure 14A:
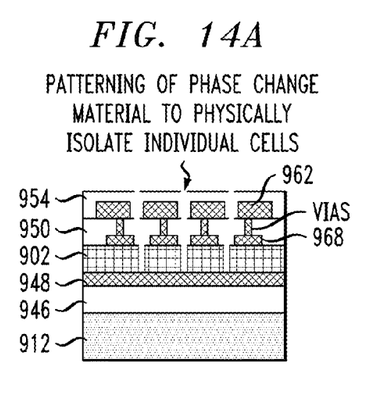
FIG. 14A is a cross-sectional diagram illustrating an optional step of patterning the phase change material (e.g., by removing the phase change material not covered by the top electrodes) so as to physically isolate individual cells having been performed according to an embodiment of the present invention.

It is notable that the depiction in FIG. 14A is merely a schematic representation intended to illustrate physical isolation of the cells. However, in practice the gaps shown by the arrow in FIG. 14A would be filled with an insulator material. Additionally the gaps in the phase change material and the filling of the gaps would be done before depositing layer 950. In fact the pattering of electrodes 968 and that of the phase change material can be done in one step so that electrode 968 is self-aligned with the cell it controls. The gap between cells will be filled with an insulator material. This material can be same as dielectric layer 950.

The current pulses required to switch the cells between the SET and RESET states depend on the actual cell dimensions. For a typical cell that was fabricated with poly-crystalline material using 90 nm lithographic techniques SET and RESET currents are in the hundreds of microampere range. RESET currents are higher than SET currents because the melting temperature that need to be reached in the RESET operation are higher than crystallization temperatures that need to be reached in the SET operation. On the other hand, SET pulses are typically much longer (often hundreds of nanoseconds or even more) because crystallization times can be long, while RESET pulses can and even have to be short to enable fast quenching without re-crystallization. Quench times (trailing edge of the RESET pulse) of a few nanoseconds are required. All of these pulse requirements change very much with device dimensions and switching currents and times are reduced for smaller devices.

As provided above, during operation of the present device, the electrodes in contact with opposite (first and second) sides of the single-crystal phase change material are used to pass current through and heat the phase change material. The original state (SET or RESET) of the cell and the applied current pulse dictate whether after pulse application the material is in the amorphous or crystalline phase. Namely, as provided above, if the material is in the amorphous phase and the current pulse will heat it above the crystallization temperature for a long enough time, it will arrange itself into a crystalline state. According to the present techniques, the phase change material starts out (based on the above-described processes) as a single-crystal material. It is desired herein that, during operation, whenever the phase change material recrystallizes it forms a single-crystal material. Advantageously, it has been found by way of the present techniques that if the phase change material of the device starts as a single-crystal material it will, during operation of the device when a crystalline state is desired, always form a monocrystalline (single-crystal) material. This aspect is further described by way of reference to FIG. 15 which shows an expanded view of the present device structure taken from FIG. 8.

Figure 15:
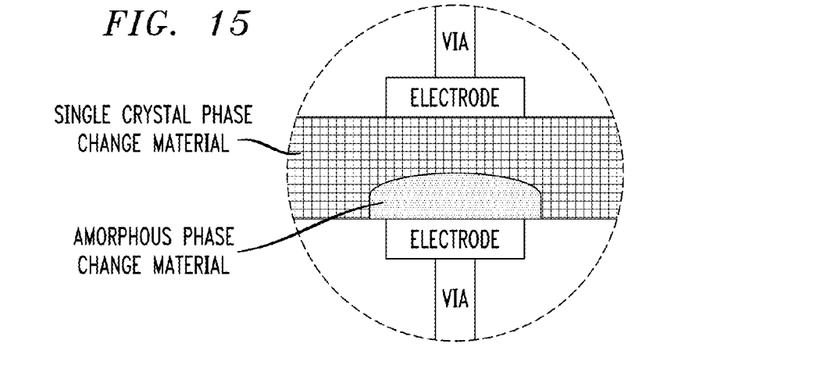
FIG. 15 is an expanded view of the structure of FIG. 8 which illustrates how the single-crystal state of the phase change material remains as a template for recrystallization of the material according to an embodiment of the present invention.

Specifically, as shown in FIG. 15, when the present phase change material is converted to an amorphous state, a portion of the phase change material remains crystalline. It is notable that during operation all that is required is that the formed region of amorphous material will block (cover) one electrode. It is not necessary (or in this case desirable) to convert the entire layer of the phase change material to the amorphous state. Thus some of the material remains monocrystalline and that serves as a template, such that the material will recrystallize as a single-crystal. It is notable that once the amorphous region covers one of the electrodes (in this case the bottom electrode) the current flow stops. It is therefore the case that only the region adjacent to that covered—(in this case bottom electrode) changes to the amorphous phase.

Figure 16:
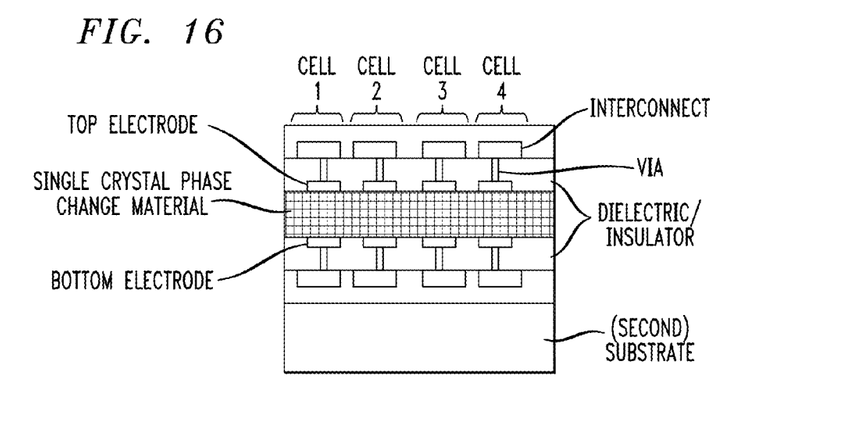
FIG. 16 is a cross-sectional diagram illustrating the present device structure and how the single-crystal phase change material forms a plurality of cells accessed by the electrodes according to an embodiment of the present invention.
Figure 17:
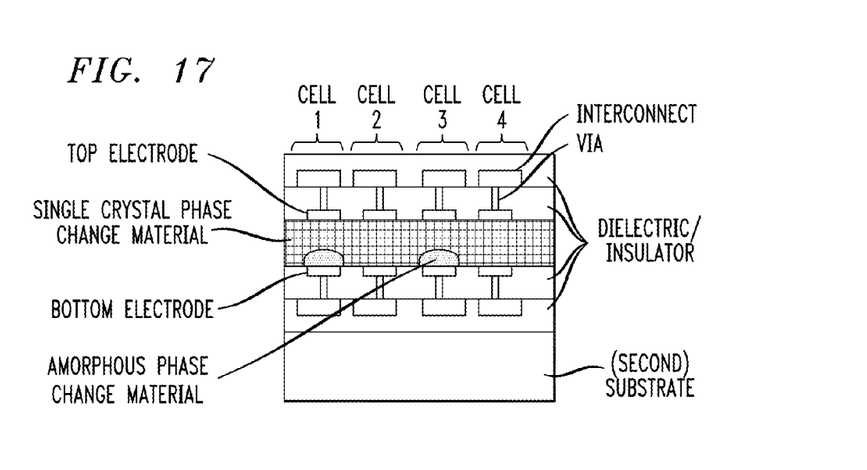
FIG. 17 is a cross-sectional diagram illustrating the device structure of FIG. 16 wherein a couple of the cells have been set to the amorphous state by passing a current through them via the electrodes according to an embodiment of the present invention.

An exemplary process for operating the present single-crystal phase change material devices (e.g., as a computer memory device) is now described by way of reference to FIGS. 16 and 17. The device configuration shown in FIGS. 16 and 17 is the same as that produced by the method illustrated in FIGS. 2-8. This is however merely exemplary and the process being described is applicable to any of the device configurations described herein. As shown in FIG. 16, the device includes a single-crystal phase change material that makes up several (in this case four) cells of the device. For example, when the device serves as a computer memory, the cells are configured/adapted to store bits of data, i.e., logical "1s" and logical "0s" see below. The cells are labeled Cell 1-Cell 4. As provided above, the cells can be physically isolated from one another by removing the phase change material not covered by the top electrodes. However, this is not required since when the cell is in the amorphous state, there is a layer of amorphous material over the electrode that blocks the current. When the cell is in the crystalline state the current flows in the least resistive path which is from the bottom electrode to the top electrode above it with very little spreading.

From the above description it is apparent that each of the cells can be configured/adapted to have one of two forms, either 1) a form which consists of solely single-crystal phase change material (the form which is present for each of the cells in FIG. 16) or 2) a form which consists of a region of single-crystal phase change material in contact with a region of amorphous phase change material (see, e.g., FIG. 17, described below). As provided above, the single-crystal phase change material is conductive, while the amorphous phase change material is highly resistive. Accordingly, a bit incorporating only single-crystal phase change material has a resistivity to electrical current that is lower than a bit incorporating a region of single-crystal phase change material in contact with a region of amorphous phase change material. In FIG. 16 all of the cells/bits are in the $1^{st}$ form. This might be the case after the device is fabricated (as per the above-described process) prior to the programming of any of the cells to store bits of data.

As shown in FIG. 16, each of the cells is accessed by a top electrode and a bottom electrode. Namely, each of the cells can be switched between the forms (1 and 2 above) by running an electric current through the cell via the electrodes. As shown in FIG. 17, in this example current introduced to the first and third cell switches these cells/bits to the $2^{nd}$ form (i.e., which consists of a region of single-crystal phase change material in contact with a region of amorphous phase change material). Accordingly, Cell 1 and Cell 3 will have a higher resistivity to electrical current than Cell 2 and Cell 4 which are in the $1^{St}$ form (i.e., which consists of solely single-crystal phase change material). A cell set to the amorphous phase would have a resistivity which is at least 10 times larger than a cell which is set to the crystalline phase. In some materials, the high/low resistivity ratio can be as high as one million. More typical ratios are about 10,000. According to an exemplary embodiment, a cell having the first form (form 1—consisting of solely single-crystal phase change material, see above) is used to store a logical "1" and a cell having the second form (form 2—consisting of a region of single-crystal phase change material in contact with a region of amorphous phase change material, see above) is used to store a logical "0." This configuration is however merely exemplary. As provided above, the resistivity of a cell set to an amorphous phase is far greater than the resistivity of a cell set to the crystalline phase (e.g., at least 100 times larger). A "read" current through a cell could then be easily used to determine the resistivity of a given cell since the differences in resistivity of the two states is so large. The "read" current employed would be much smaller than the current used to write data to the device, i.e., a "write" current. The "read" current only senses the cell state and does not trigger a change of the cell state. The determination of an appropriate "read" and "write" current, given the present teachings, would be within the capabilities of one of skill in the art.

Figure 18:
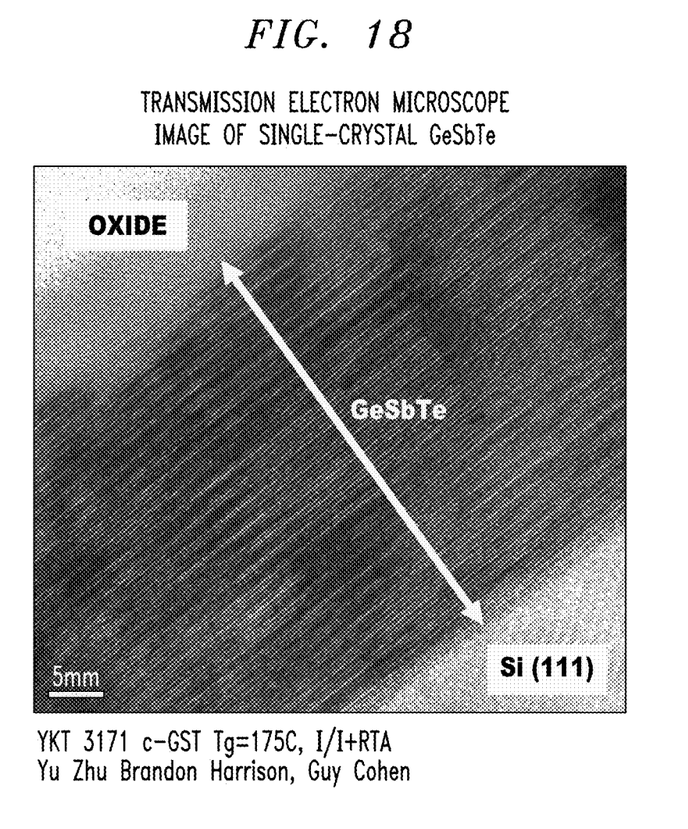
FIG. 18 is a high-resolution transmission electron microscope (TEM) micrograph confirming the single-crystal structure of the phase change material layer formed using the present techniques according to an embodiment of the present invention.

FIG. 18 is a high-resolution TEM lattice imaging analysis confirming of the single-crystal structure of the phase change material layer formed using the present techniques. In the example shown in FIG. 18, the single-crystal phase change material is germanium-antimony telluride formed over a Si (111) substrate.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating an electronic device, comprising the steps of:
   forming a single-crystal phase change material on a first substrate;
   forming at least one first electrode in contact with a first side of the single-crystal phase change material, wherein the single-crystal phase change material and the at least one first electrode in contact with the first side of the single-crystal phase change material comprise a transfer structure on the first substrate;
   transferring the transfer structure to a second substrate; and
   forming at least one second electrode in contact with a second side of the single-crystal phase change material.

2. The method of claim 1, wherein the first substrate comprises a Si (111) substrate.

3. The method of claim 1, wherein the single-crystal phase change material comprises a single-crystal epitaxial chalcogenide phase change material.

4. The method of claim 3, wherein the single-crystal epitaxial chalcogenide phase change material is an alloy comprising at least two of: antimony, tellurium, and germanium.

5. The method of claim 1, wherein the single-crystal epitaxial phase change material is an alloy comprising antimony and one of germanium or gallium.

6. The method of claim 1, wherein the single-crystal phase change material is formed on the first substrate using an epitaxial deposition process.

7. The method of claim 6, wherein the epitaxial deposition process is performed at a temperature of from about 150° C. to about 300° C.

8. The method of claim 6, wherein the epitaxial deposition process is performed at a temperature of from about 175° C. to about 200° C.

9. The method of claim 1, wherein the step of forming the at least one first electrode in contact with the first side of the single-crystal phase change material comprises the steps of:
   depositing a metal onto the first side of the single-crystal phase change material; and
   patterning the metal into the at least one first electrode.

10. The method of claim 1, wherein the step of forming the at least one second electrode in contact with the second side of the single-crystal phase change material comprises the steps of:
   depositing a metal onto the second side of the single-crystal phase change material; and
   patterning the metal into the at least one second electrode.

11. The method of claim 1, further comprising the steps of:
   depositing a first planarizing dielectric layer onto the first side of the single-crystal phase change material burying the at least one first electrode;
   forming at least one via extending through the first planarizing dielectric layer and in contact with the at least one first electrode;
   forming at least one first interconnect on the first planarizing dielectric layer in contact with the at least one via;
   depositing a second planarizing dielectric layer on the first planarizing dielectric layer burying the at least one first interconnect;
   depositing a third planarizing dielectric layer on the second side of the single-crystal phase change material burying the at least one second electrode;
   forming at least one via extending through the third planarizing dielectric layer and in contact with the at least one second electrode;
   forming at least one second interconnect on the third planarizing dielectric layer in contact with the at least one via; and
   depositing a fourth planarizing dielectric layer on the third planarizing dielectric layer burying the at least one second interconnect.

12. The method of claim 1, wherein the step of transferring the transfer structure from the first substrate to the second substrate comprises the steps of:
   flipping the transfer structure on the first substrate;
   bonding the transfer structure to the second substrate; and
   removing the first substrate.

13. The method of claim 12, wherein the first substrate is removed using backside wafer grinding followed by a selective wet etch.

14. The method of claim 1, wherein the step of forming the at least one first electrode in contact with the first side of the single-crystal phase change material comprises the step of:
   depositing a metal onto the single-crystal phase change material.

15. The method of claim 1, further comprising the steps of:
   depositing a first planarizing dielectric layer onto the at least one first electrode;
   depositing a second planarizing dielectric layer onto the second side of the single-crystal phase change material burying the at least one second electrode;
   forming at least one via extending through the second planarizing dielectric layer and in contact with the at least one second electrode;
   forming at least one second interconnect on the second planarizing dielectric layer in contact with the at least one via; and
   depositing a third planarizing dielectric layer on the first planarizing dielectric layer burying the at least one second interconnect.

* * * * *